United States Patent [19]

Yamakawa et al.

[11] Patent Number: 5,219,803
[45] Date of Patent: Jun. 15, 1993

[54] SINTERED BODY OF ALUMINUM NITRIDE

[75] Inventors: Akira Yamakawa; Masaya Miyake; Hitoyuki Sakanoue; Koichi Sogabe, all of Itami, Japan

[73] Assignee: Sumitomo Electric Industries, Ltd., Japan

[21] Appl. No.: 803,117

[22] Filed: Dec. 5, 1991

Related U.S. Application Data

[62] Division of Ser. No. 352,265, May 16, 1989, abandoned.

Foreign Application Priority Data

May 16, 1988 [JP] Japan .................. 63-116843

[51] Int. Cl.⁵ .............................. C04B 35/10
[52] U.S. Cl. ....................... 501/96; 501/98
[58] Field of Search .................... 501/96, 98

[56] References Cited

U.S. PATENT DOCUMENTS

| | | | |
|---|---|---|---|
| 4,833,108 | 5/1989 | Mizuno et al. | 501/98 |
| 4,843,038 | 6/1989 | Kuratoni et al. | 501/96 X |
| 4,883,780 | 11/1989 | Kasori et al. | 501/96 |
| 5,077,245 | 12/1991 | Miyahara | 501/96 |

*Primary Examiner*—Mark L. Bell
*Assistant Examiner*—Deborah Jones
*Attorney, Agent, or Firm*—Jordan B. Bierman

[57] ABSTRACT

The present invention provides a sintered body of aluminum nitride comprising (i) aluminum nitride as a main component and (ii) at least one component selected from the group consisting of Zr, Hf, V, Nb, Ta, Cr, Mo, W, Fe, Co, Ni, Nd, Ho, Ti and compounds thereof in the total amounts of not greater than 1.0 wt.% and not less than 0.01 wt.% in terms of elements on the basis of sintered body, the sintered body being colored and having a thermal conductivity of at least 150 W/mK. The sintered body is useful for the preparation of circuit boards having printed circuits thereon and highly heat-releasing ceramic packages for semiconductive devices.

3 Claims, No Drawings

SINTERED BODY OF ALUMINUM NITRIDE

This application is a division of application Ser. No. 07/352,265 filed Jun. 16, 1989 open abandoned.

BACKGROUND OF THE INVENTION

1. Field of the Invention

The present invention relates to colored sintered bodies of aluminum nitride and, more specifically, to sintered bodies of aluminum nitride which have a high density, a high thermal conductivity and a desired color, such as brownish black, brown, green, etc.

The present invention further relates to circuit boards and packages including semiconductor devices in which sintered bodies of aluminum nitride above mentioned are employed.

2. Description of the Prior Art

In recent years, there has been a remarkable progress in large scale integration (LSI) technology and considerable improvements have been made in the integration techniques.

Improvements in size of integrated circuit (IC) chips contribute to such recent LSI innovations. As the size of IC chips has been increasingly improved, generation of heat for each package also becomes larger. Accordingly, the heat dissipation property of substrate materials has become increasingly important. Heretofore, sintered alumina has been employed as an IC substrate material. However, since the thermal conductivity of the sintered alumina is not sufficient for permitting satisfactory heat release, the conventional sintered alumina can not provide satisfaction for such increasing heat generation of IC chips. For this, beryllia having a high thermal conductivity has been studied as a substitute for the sintered alumina substrate, but it is difficult to handle because of its strong toxity.

Sintered aluminum nitride (AlN) has become of interest as substrate materials for circuit boards and packaging materials in the semiconductive industry, because it inherently has a high thermal conductivity and a high electrical insulating property and is nontoxic.

As set forth above, aluminum nitride has a high thermal conductivity and a good insulating property in the state of single crystal. However, in case where sintered bodies are prepared from aluminum nitride powder by compression-molding followed by sintering, the resultant sintered bodies, although depending on sintering conditions, exhibit a low relative density i.e., at most, of the order of 70 to 80% (based on theoretical density of 3.26 g/cm$^3$ of aluminum nitride) and include a large number of pores, because of poor sinterability of aluminum nitride powder per se.

The mechanism of heat conduction of insulating ceramics, like aluminum nitride, is mainly based on transmission of phonons. However, since the defects due to pores, impurities, etc., of the ceramics may cause phonon scattering, actually there can be obtained only sintered bodies of aluminum nitride having a low heat conduction level. Under such circumstances, many methods have been proposed to achieve aluminum nitride sintered products having a high thermal conductivity.

However, in order to produce aluminum nitride sintered products of high thermal conductivity, highly pure raw materials should be employed and inclusion of impurities which may be caused during the production process should be held as small as possible. Sintered products of aluminum nitride obtained in such conditions are limited to white transparent products or faintly colored products. There have not been yet obtained colored sintered products of aluminum nitride having a high thermal conductivity. Accordingly, it is highly desirable to develop colored sintered bodies of aluminum nitride for applications where lighttransmitting properties are considered as an important matter.

SUMMARY OF THE INVENTION

In view of the foregoing facts, an object of the present invention is to provide a sintered body of aluminum nitride which has a high thermal conductivity and is colored.

Another object of the present invention is to provide substrate materials for circuit boards and packaging materials for semiconductor devices in which the sintered bodies are employed.

The present inventors have been made many studies and extensive experimentation to eliminate the abovementioned disadvantages and arrived at the discovery that addition of certain elements or their compounds to aluminum nitride is effective. The present invention has been made based on this discovery.

According to one aspect (1) of the present invention, there is provided a sintered body of aluminum nitride comprising (i) aluminum nitride as a main component and (ii) at least one component selected from the group consisting of Zr, Hf, V, Nb, Ta, Cr, Mo, W, Fe, Co, Ni, Nd, Ho, Ti, and compounds thereof in the total proportion of not greater than 1.0 wt.% and not less than 0.01 wt.% in terms of elements on the basis of sintered body, said sintered body being colored and having a thermal conductivity of at least 150 W/mK.

In another aspect (2) of this invention, there is also provided a circuit board comprising the abovementioned colored sintered body of aluminum nitride comprising aluminum nitride as a main component and having a thermal conductivity of at least 150 W/mk and printed circuits formed onto the colored sintered body using a conductive paste.

A still further aspect (3) provides a highly heatconducting ceramic package comprising a substrate made of the colored sintered body of aluminum nitride consisting mainly of aluminum nitride and having a thermal conductivity of at least 150 W/mK, a semiconductor device and a lead-frame.

In the present invention, as the coloring agent used to obtain the colored sintered bodies of aluminum nitride having a high thermal conductivity, there may be mentioned the following transition elements or their compounds.

As the additive for black coloration, there may be mentioned $ZrO_2$, $HfO_2$, $V_2O_3$, $Nb_2O_3$, $Ta_2O_3$, Cr, Mo, $WO_3$, MnO, $Fe_2O_3$, CoO, NiO, $TiO_2$, etc. Further, there may be added $Nd_2O_3$, etc. for brown coloration and $Ho_2O_3$, etc., for green coloration. However, the coloring agents which may be employed in the present invention are not limited to the oxide additives as mentioned above. Any compound can be used as long as it yields the transition elements as specified above by thermal decomposition. Examples of such compounds include carbonates, hydroxides, organic compounds of the transion metal elements.

The aforesaid coloring additives may be employed either singly or, if desired, in combination of two or more thereof.

Besides the foregoing additives, one or more components selected from the group consisting of elements of IIa and IIIa of the Periodic Table (IUPAC Version) and compounds thereof may be also used in the total proportion of 0.01 to 1.0 wt.%, preferably not greater than 0.1 wt.% within the range, on the basis of the sintered aluminum nitride body as a sintering aid.

DETAILED DESCRIPTION OF PREFERRED EMBODIMENTS

For a better understanding, the present invention will be described in more detail hereinafter.

In practing the present invention, aluminum nitride is used in the form of powder and preferably, has a specific surface area of at least 2.0 $m^2/g$. When the specific surface area is less than 2.0 $m^2/g$, sintered bodies of high density can not be obtained.

In the production of black sintered bodies according to the present invention, one or more components selected from the group consisting of the transition elements of Zr, Hf, V, Nb, Ta, Cr, Mo, W, Fe, Co, Ni, and Ti, or compounds thereof are added in the total proportion of 0.01 to 1.0 wt.% based on the total weight of the resulting sintered body into aluminum nitride powder. When the transition elements are added in a compound form, the addition amounts of 0.01 to 1.0 wt.% are given as elements throughout the present specification, unless otherwise specified. In addition, if desired, one or more components selected from IIa and IIIa elements of the Periodic Table and compounds thereof are added as a sintering aid in their total of 1.0 to 0.01 wt.% on the basis of the sintered product. When the sintering aid is used in a compound form, the addition amount is given as element. The resulting composition can be compacted by heating under a non-oxidizing atmospher including nitrogen, thereby providing sintered bodies having a desired color.

In the production of black-colored sintered bodies, highly pure aluminum nitride should be employed and the impurities should be controlled as follows. The oxygen content and the carbon content should be limited within the amounts of not greater than 2.0 wt.% and not greater than 0.5 wt.%, respectively. Further, other impurities excluding transition metals and compounds thereof should not exceed 0.01 wt.% in terms of elements on the basis of aluminum nitride powder. Transition metal elements and their compounds as impurities should not be exceed 0.1 wt.% in terms of elements on the basis of aluminum nitride powder in which the transion metals and their compounds specified above as coloring agents are excluded. If the impurities are not limited as specified above, required levels of thermal conductivity and coloration can not be achieved at the same time.

In order to obtain aluminum nitride sintered bodies of high thermal conductivity which are colored in brown or green, further purified aluminum nitride powder should be employed. For this purpose, the purity of aluminum nitride powder is controlled so that the transition metal elements and their compounds as impurities should be limited up to 0.01 wt.% in their total (calculated as elements) on the basis of aluminum nitride powder.

As the sintering agent and coloring agent to be added to such aluminum nitride powder, there are used Nd, Ho and their compounds in the range of 1.0 to 0.01 wt.% in their total amounts as elements on the basis of sintered body. For example, addition of Nd will give sintered aluminum nitride colored in brown.

In the present invention, coloring agents of the same color may be used alone or in combination of two or more thereof and coloring agents of different colors may be also used alone or in combination thereof.

The colored sintered aluminum nitride thus obtained according to the present invention have all a high thermal conductivity of at least 150 W/mK and are useful as substrates for circuit boards in which thick film paste (e.g. Ag paste, Au paste, etc., or a high melting-point metal paste, for example, of W, Mo, etc.) is printed onto the surface of the dense sintered body and then fired.

Further, the substrate thus obtained are combined with a semiconductor device and a lead-frame to assemble an IC package.

The invention will be more clearly understood with reference to the following Examples. In the Examples, all percentages of the foregoing additives to be aluminum nitride are all indicated in the term of elements on the basis of total weight of the resulting sintered bodies, unless otherwise indicated.

EXAMPLE 1

Aluminum nitride powder [specific surface area: 3.5 $m^2/g$ (measured by BET method), oxygen content: 1.3 wt.%, and metal impurities: 0.01 wt.%] was mixed with 1.0 wt.% of phenol resin and 0.5 wt.% of $Y_2O_3$ and then additives as shown in Table were added to prepare molded bodies (30 mm × 30 mm × 3 mm).

The molded bodies were fired at a temperature of 1950° C. for 5 hours in a stream of nitrogen gas and plate-like sintered bodies were obtained. The thus obtained sintered bodies were examined for color, thermal conductivity and density and the results are shown in Table.

It is clear from Table that the sintered bodies of aluminum nitride of the present invention are satisfactorily colored. Further, the sintered bodies have been found to have a high thermal conductivity and other superior properties which can not be achieved in any conventional sintered aluminum nitride.

EXAMPLE 2

A commercially available Au paste was printed onto the sintered body No. 1 given in Example 1 and fired at 930° C. in air. It was found that the conductive circuit pattern formed on the sintered body had a bonding strength of 3 $kg/m^2$. From such results, the sintered body of aluminum nitride of the present invention is useful as substrate materials for good heat-conducting circuit boards.

TABLE

| No. | Additives | | Properties of sintered bodies | | |
| --- | --- | --- | --- | --- | --- |
|  |  |  | color | Thermal conductivity | Density |
| 1 | $Nd_2O_3$ | 0.8 wt. % | Brown | 220 | 3.26 |
| 2 | $Ca_2CO_3$ | 0.8 wt. % | White transparent | 180 | 3.26 |
| 3 | $TiO_2$ | 1.2 wt. % | Black | 80 | 3.26 |
| 4 | $Ho_2O_3$ | 0.8 wt. % | Green | 220 | 3.26 |
| 5 | $TiO_2$ | 0.8 wt. % | Black | 160 | 3.26 |
| 6 | $ZrO_2$ | 0.8 wt. % | Black | 170 | 3.26 |
| 7 | $V_2O_3$ | 0.8 wt. % | Black | 160 | 3.26 |
| 8 | $WO_3$ | 0.8 wt. % | Black | 180 | 3.26 |
| 9 | MnO | 0.8 wt. % | Black | 170 | 3.26 |
| 10 | $Fe_2O_3$ | 0.8 wt. % | Black | 160 | 3.26 |
| 11 | CoO | 0.8 wt. % | Black | 160 | 3.26 |
| 12 | NiO | 0.8 wt. % | Black | 170 | 3.26 |

TABLE-continued

| No. | Additives | | Properties of sintered bodies | | |
| --- | --- | --- | --- | --- | --- |
| | | | color | Thermal conductivity | Density |
| 13 | Al$_2$O$_3$ | 0.8 wt. % | White | 100 | 3.26 |
| 14 | SiO$_2$ | 0.8 wt. % | White | 120 | 3.26 |

Note:
Nos. 2, 3, 13 and 14: Sintered bodies outside the present invention

As described above, according to the present invention, there can be obtained sintered bodies of aluminum nitride having a high thermal conductivity. The sintered bodies of aluminum nitride are colored in black, brown, green, etc. and transparent or semi-transparent white sintered bodies are not produced. Accordingly, the sintered bodies of the present invention are very useful as excellent heat-releasing substrate materials or parts in IC substrates, packages or the like; in applications in which lighttransmission is undesirable; in optical sensors which are used in automatic operation lines, etc.

What is claimed is:

1. A method of forming a colored sintered body of aluminum nitride having a thermal conductivity of at least 150 W/mK, said method comprising the addition of at least one colorant component selected from the group consisting of Zr, Hf, V, Nb, Ta, Cr, Fe, Co, Ni, Nd, Ho, Ti, and compounds thereof, in a total proportion of 0.01 to 1.0 wt.%, based on said sintered body, to an AlN powdered material having an oxygen content not greater than 2.0 wt.%, a carbon content not greater than 0.5 wt.%, a total amount of impurities other than said oxygen, carbon and colorants not greater than 0.01 wt.%, all weights being based on total weight of said sintered body, said AlN powdered material having a total amount of transition metal elements and compounds thereof as impurities, in an amount of 0.1 wt.% or less, to form a mixture and, sintering said mixture to form said sintered body.

2. The method of claim 1 wherein said sintered body further includes, as a sintering aid, at least one component selected from IIa and IIIa elements of the Periodic Table (IUPAC Version) and compounds thereof in a total proportion of 0.01 to 1.0 atomic weight %, on the basis of said sintered body.

3. The method of claim 1 wherein said aluminum nitride has a specific surface area of at least 2.0 m$^2$/g measured by a BET method.

* * * * *